United States Patent [19]

Long

[11] Patent Number: 5,160,408
[45] Date of Patent: * Nov. 3, 1992

[54] METHOD OF ISOTROPICALLY DRY ETCHING A POLYSILICON CONTAINING RUNNER WITH PULSED POWER

[75] Inventor: Paul Long, Meridian, Id.

[73] Assignee: Micron Technology, Inc., Boise, Id.

[ * ] Notice: The portion of the term of this patent subsequent to May 5, 2009 has been disclaimed.

[21] Appl. No.: 516,054

[22] Filed: Apr. 27, 1990

[51] Int. Cl.$^5$ .......................................... H01L 21/00
[52] U.S. Cl. .................................. 156/656; 156/643; 156/646; 156/657; 156/659.1; 156/662
[58] Field of Search ............... 156/646, 643, 657, 656, 156/659.1, 662

[56] References Cited

U.S. PATENT DOCUMENTS

| | | | |
|---|---|---|---|
| 4,468,285 | 8/1984 | Bayman et al. | 156/646 |
| 4,473,436 | 9/1984 | Beinvogl | 156/643 |
| 4,477,310 | 10/1984 | Park et al. | 156/643 |
| 4,502,913 | 3/1985 | Lechaton et al. | 156/643 |
| 4,713,141 | 12/1987 | Tsang | 156/646 |
| 4,741,799 | 5/1988 | Chen et al. | 156/646 |
| 4,778,563 | 10/1989 | Stone | 156/646 |
| 4,824,802 | 4/1989 | Brown et al. | 437/187 |
| 4,836,887 | 6/1989 | Daubenspeck et al. | 156/646 |
| 4,863,549 | 9/1989 | Grünwald | 156/646 |
| 4,891,118 | 1/1990 | Ooiwa et al. | 156/643 |

OTHER PUBLICATIONS

"Plasma Etching In Semiconductor Fabrication"; by Russ A. Morgan; ©1985; Elsevier Co. N.Y., NY.

Wolf et al., "Silicon Processing For The VLSI Era-vol. 1: Process Technology", pp. 551-557.
Flamm et al., "The Design of Plasma Etchants", (1981) pp. 317-363.
Mogab, "VLSI Technology", pp. 303-342.

Primary Examiner—David A. Simmons
Assistant Examiner—George Goudreau
Attorney, Agent, or Firm—Wells, St. John & Roberts

[57] ABSTRACT

Disclosed is a method of isotropically dry etching a current conducting runner comprising polysilicon material which is formed on a silicon substrate wafer containing integrated semiconductor circuits. The method employs a parallel plate reactor which is controllable to provide intermittent pulses of power over the parallel plates. Gases are injected to within the reactor to provide a reactive gas mixture at a preselected pressure. Preselected intermittent pulses of power are applied to ionize the reactive gas mixture into a plasma state. Such intermittent pulses are defined by an RFon period, an RFoff period, and an RFrepeat period. The ratio of RFon:RFrepeat is preferably from about 0.35 to 0.60. The wafer is subjected to the intermittent pulses and reactive gas mixture at the preselected pressure for a preselected amount of time to selectively isotropically etch the current conducting runner. The invention has specific application to isotropically dry etching a WSi$_x$/polysilicon sandwich structure. With such a structure, the preferred reactive gas mixture is SF$_6$, Cl$_2$, O$_2$, and an inert carrier gas in approximate respective volume ratios of 10.0±5%:2.0±5%:3.0±5%:15.0±5%.

14 Claims, 3 Drawing Sheets

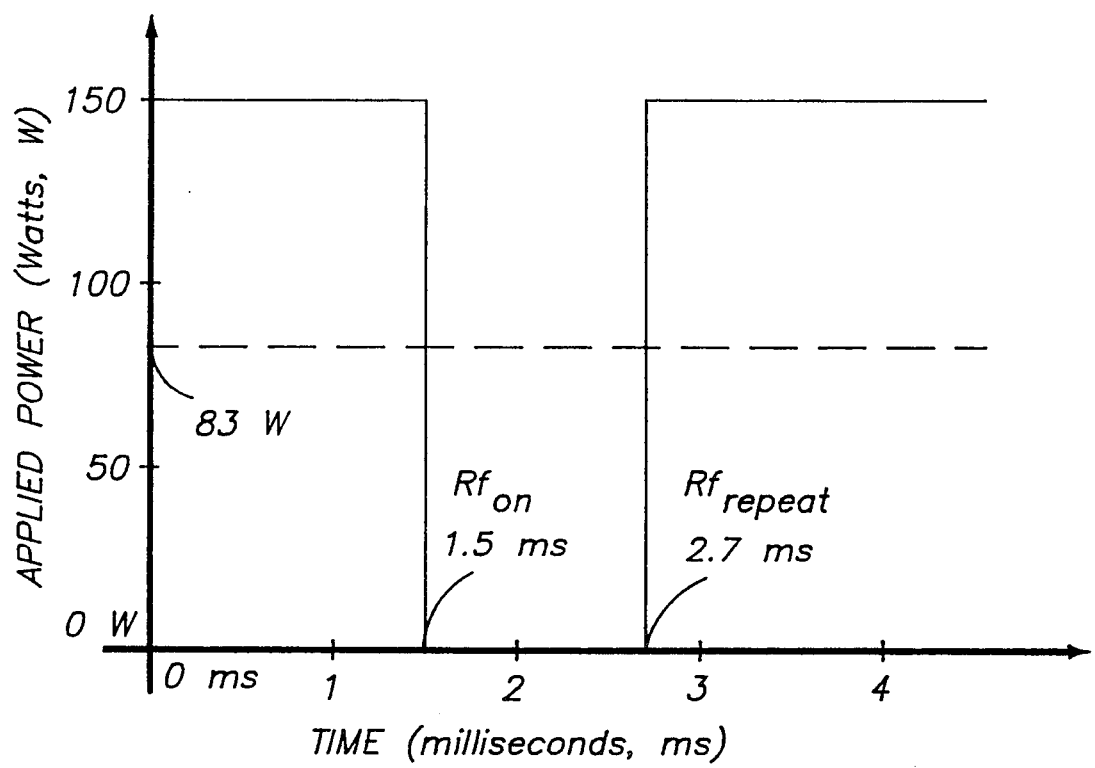

METHOD OF ISOTROPICALLY DRY ETCHING A POLYSILICON CONTAINING RUNNER WITH PULSED POWER

TECHNICAL FIELD

The invention relates to a method of dry etching a polysilicon containing current conducting runner in an isotropic manner using a pulsed parallel plate reactor, and to a method of isotropically dry etching a $WSi_x$/polysilicon sandwich structure with such a reactor.

BACKGROUND OF THE INVENTION

Integrated circuits are chemically and physically integrated into a substrate, such as a silicon wafer, by patterning regions in the substrate, and by patterning layers on the substrate. These regions and layers can be conductive, for conductor and resistor fabrication. They can also be of different conductivity types, which is essential for transistor and diode fabrication.

Deposited conductors are an integral part of every integrated circuit, and provide the role of surface wiring for conducting current. Specifically, the deposited conductors are used to wire together the various components that are formed in the surface of the wafer. Such conductors are commonly known as "lines" or "runners". Conductors also provide other functions in integrated circuit structures, such as fuses and backside electrical contacts for the packaged die.

The conductive lines or runners are preferably formed of a highly electrically conductive material, such as metal. Another common conductive material for producing the surface wiring effect is polysilicon (hereafter poly). A concern in forming poly lines or runners is to protect the immediate area on either side of the runner from the next implant step. FIG. 1 diagrammatically illustrates in an enlarged and exaggerated sectional view a doped poly runner 12 which has been provided atop a thin $SiO_2$ layer 11 on a doped silicon substrate 10. A photoresist mask layer 14 is provided atop the poly and is dimensioned to have a greater width than the desired finished width of the poly runner. As illustrated, this leaves a resist overhang on either side of poly runner 12 due to the greater width of the resist layer compared to that of poly runner 12.

This structure can be provided by isotropically dry etching the poly within a parallel plate reactor. A desired chemically reactive gas mixture is provided within such a reactor, and the mixture energized to a plasma state. The chemically reactive mixture is designed to be reactive with the poly, but not the photoresist or the silicon dioxide layer atop the substrate. The effect is to etch the poly runner to a narrower width beneath photoresist 14, as indicated by isotropic etching lines A. The term "isotropic etch" is an accepted term within the semiconductor industry which indicates an etching process which removes unmasked material in both a downward and sideward direction, as shown. Conversely, the term "anisotropic etch" defines an etching process which doesn't attack the masked material from the side, but merely etches in a direction which is perpendicular to the work piece. The isotropic etch of FIG. 1 is relatively simple since there is just one material being etched, namely the poly. At the completion of the etch, the next layer of material would be applied, the resist would then be removed, and the wafer would continue on through other process steps.

As the size of the integrated circuit shrinks, the speed that the current flows along the conductive runners becomes a critical issue. One way of increasing the speed of a poly runner is to deposit a more highly conductive metal silicide layer atop the poly. Such a layered poly structure lowers the total resistance of the runner.

One such structure consists essentially of a layer of $WSi_x$ which overlies poly. The process of isotropically etching a $WSi_x$/polysilicon sandwich is difficult because of the different etch characteristics of poly and tungsten (W). One of the usual outcomes of trying to etch both of these levels at the same time is presented in FIG. 2 where a tungsten layer 16 is etched at a faster rate than underlying poly layer 12. Dependent upon etch chemistry and etch processing parameters, the opposite problem is presented in FIG. 3 where the poly etch rate is much faster than the tungsten etch rate.

One of the ways that these problems have been overcome is by use of an anisotropic etch as illustrated in FIG. 4. Here, the resist is provided such that there would be no overhang of the finished width of the runner, with the anisotropic etch exemplified by lines B resulting in vertical sidewalls as illustrated. The resist would then be removed and the wafer passed through a spacer process to leave a small amount of oxide 18 on both sides of the conductive runner, as illustrated in FIG. 5. Oxide 18 acts as an implant block to provide the same function that a resist overhang does in an isotropic etch. However, this method involves several extra processing steps.

In some etching operations, it is desirable to achieve anisotropic etching and to operate at very high power densities on the parallel plates. However, photoresist masking can burn at these high power densities. Intermittent pulse reactors were developed to provide a high power anisotropic etch without etching away the photoresist in the process. This invention relates specifically to these types of etchers.

The primary manufacturer of intermittent pulse anisotropic plasma etchers is the Tegal Corp. of Petaluma, Calif. One of their reactors is the Tegal Model 1511e Plasma Reactor which spaces the parallel plates at a fixed distance from one another. Such a reactor is provided with operator controllable power pulsing in order to obtain the desired selective anisotropic etch, depending upon the material being etched and the plasma gas chemistry. When current is applied at a selected rate, an RF field directs ion radicals perpendicularly toward the work piece to achieve an anisotropic etch. Under high current density, the current is intermittently pulsed to an "off" condition to avoid burning away photoresist. This provides the operator with the ability to achieve the effects of high current density etching without removing photoresist.

In this document, the intermittent pulsing is referred to as being defined by an RFon period, an RFoff period, and an RFrepeat period. The "RFon" period is that time period during which the preselected amount of power is applied to the parallel plates. The "RFoff" period is that time period when a significantly reduced amount of power or no power is applied to the parallel plates. The RFrepeat period is the sum of a single RFon period and a single consecutively following RFoff perriod.

It is desirable that RFoff be as short as possible to minimize the etching treatment time, yet still achieve the high current anisotropic etch without removing photoresist. Tegal recommends and is able to achieve the desired etching in most instances with an RFon of 1.8 ms and RFoff of 0.2 ms, to provide an RFrepeat of 2.0 ms. This provides a ratio of RFon:RFrepeat of 0.90.

At this writing, their is no indication by the manufacturer or elsewhere in the prior art that such intermittent pulsing reactors might be operated to produce an isotropic etch, or how one might operate such a reactor to produce an isotropic etch.

One object of this invention is to isotropically dry etch a current conducting runner comprising polysilicon material with an intermittent pulse plasma reactor.

Another object of this invention is to produce an isotropic etching effect in a $WSi_x$/polysilicon sandwich structure beneath a layer of photoresist to provide a photoresist overhang of the finished width $WSi_x$/polysilicon width runner by using an isotropic etching process with such a reactor.

BRIEF DESCRIPTION OF THE DRAWINGS

The preferred embodiment of the invention is illustrated in the accompanying drawings, in which:

FIG. 7 is a graphical representation of applied power vs. time in operation of a Tegal 1511e reactor in producing the etching effect illustrated by FIG. 6.

DETAILED DESCRIPTION OF THE PREFERRED EMBODIMENTS

Figure 1:
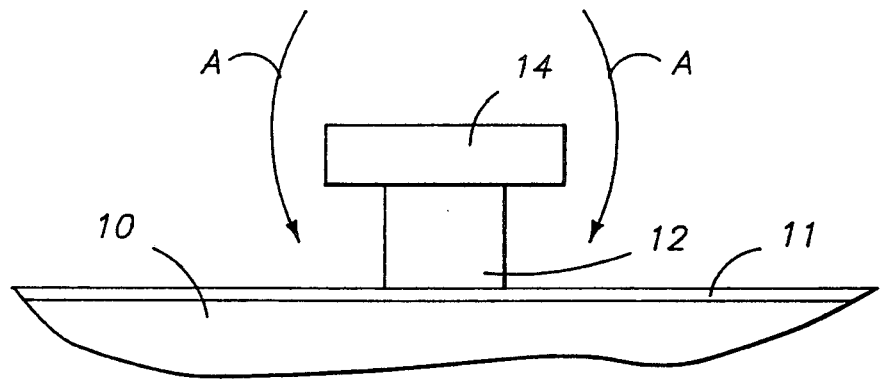
FIGS. 1-5 are enlarged diagrammatic sectional views of a semiconductor wafer having a conductive runner layered thereon, and are discussed in the Background section of this document above.
Figure 2:
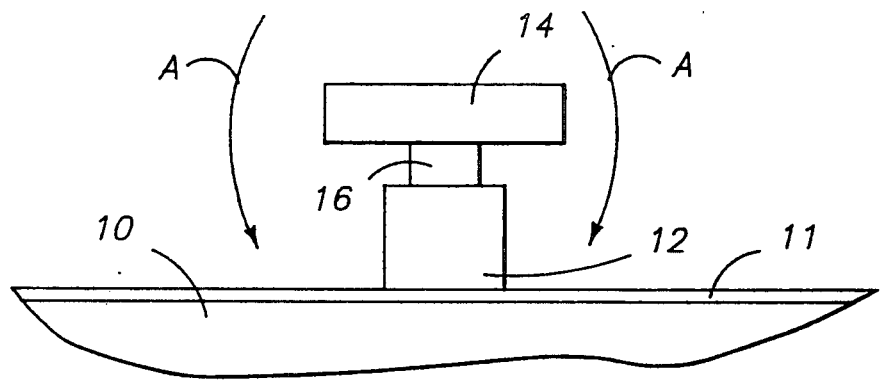
Figure 3:
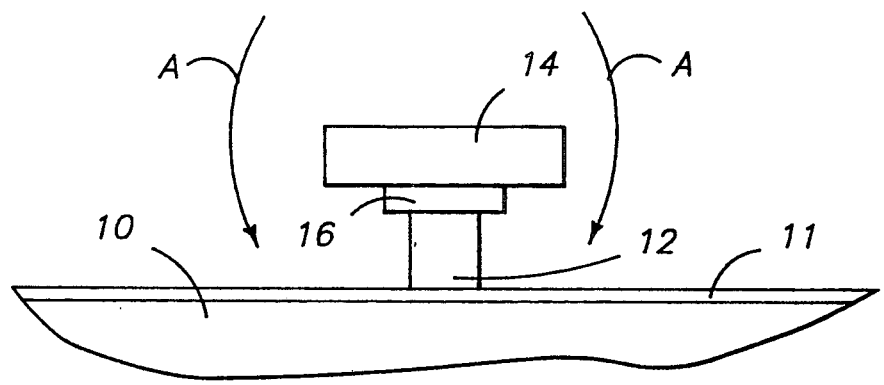
Figure 4:
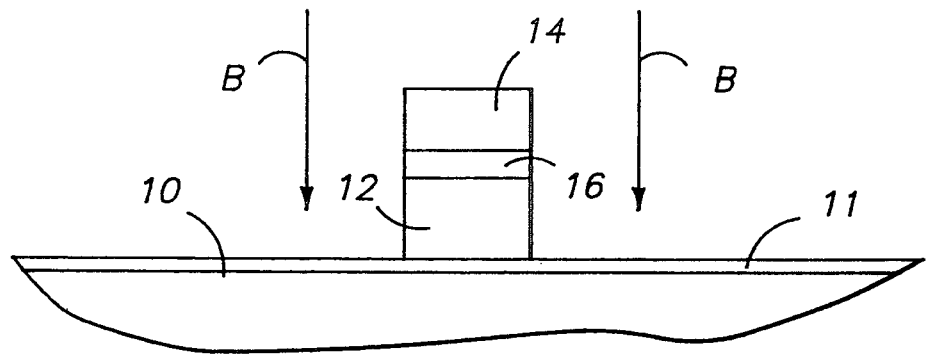
Figure 5:
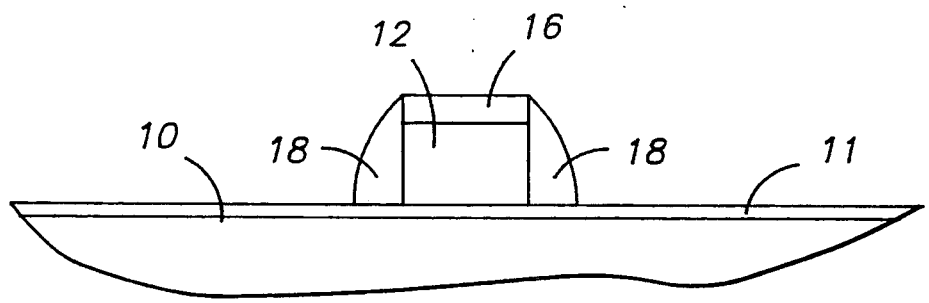

The following disclosure of the invention is submitted in furtherance with the constitutional purpose of the Patent Laws "to promote the progress of science and useful arts" (Article 1, Section 8).

In accordance with the invention, a method of isotropically dry etching a current conducting runner comprising polysilicon material which is formed atop a silicon substrate wafer containing integrated semiconductor circuits, and having an upper layer of $SiO_2$, comprises:

placing the wafer within a parallel plate reactor which is controllable to provide intermittent pulses of power over the parallel plates, injecting gases to within the reactor to provide a reactive gas mixture at a preselected pressure within the reactor, the reactive gas mixture being formulated to selectively etch the current conducting runner;

applying preselected intermittent pulses of a preselected amount of power to the parallel plates to ionize the reactive gas mixture into a plasma state;

the ratio of RFon:RFrepeat being from about 0.35 to 0.60;

subjecting the wafer to the intermittent pulses and reactive gas mixture at the preselected pressure for a preselected amount of time to selectively isotropically the current conducting runner.

The method provides for an uncharacteristically high RFoff period which produces "dead time" in the applied RF field. This causes the ion radicals of the plasma to be directed other than perpendicularly toward the work piece, with the effect being to isotropically etch the poly containing runner.

The most preferred ratio of RFon:RFrepeat is from about 0.50 to 0.60. RFoff is preferably at zero power, but could be some value above zero and significantly less than RFon power which would provide the desired pulsing effect without etching photoresist. The preferred predetermined amount of power produces a power density at the parallel plates during RFon of from about 0.76 to about 0.93 $W/cm^3$. The reaction was reduced to practice with a Tegal 1511e Plasma Reactor, although other model and brand reactors are expected to be usable in accordance with the invention.

The invention also comprises a method of isotropically dry etching a $WSi_x$/polysilicon sandwich structure atop a silicon substrate wafer containing integrated semiconductor circuits, and having an upper layer of $SiO_2$, using an intermittent pulse plasma reactor. The process is preferably conducted with the $WSi_x$/polysilicon sandwich structure lying beneath a layer of photoresist, with the photoresist having a greater width than the desired finished width of the $WSi_x$/polysilicon runner to produce an overhang.

The preferred amount of power density in operating such a reactor in accordance with this aspect of the invention is also from about 0.76 to about 0.93 $W/cm^3$ during RFon. With a Tegal 1511e reactor, these densities can be provided with power inputs of 135 W and 165 W, respectively. Most preferred is a power density of 150 W, an RFon of about 1.5 ms, and an RFrepeat of about 2.7 ms. This provides an effective continuous power input of about 83 W.

The preferred ratio of RFon:RFrepeat is from about 0.35 to 0.60, with 0.50 to 0.60 being most preferred. The optimum for RFon and RFrepeat was determined to be about 1.5 ms and 2.7 ms, respectively.

$SF_6$, $Cl_2$ and $O_2$ are injected to within the reactor to provide a reactive gas mixture at a preselected pressure. The flow rates to the reactor of the gases are such to provide approximate respective volume ratios of $SF_6$, $Cl_2$, and $O_2$ of $10.0\pm5\%$: $2.0\pm5\%$: $3.0\pm5\%$. Preferably an inert carrier gas, such as helium, is injected into the reactor with the $SF_6$, $Cl_2$, and $O_2$ gases that form the reactive gas mixture. The inert carrier gas is preferably injected to provide approximate respective volume ratios of $SF_6$, $Cl_2$, $O_2$ and inert carrier gas of $10.0\pm5\%$: $2.0\pm5\%$: $3.0\pm5\%$: $15.0\pm5\%$. The preferred predetermined pressure within the reaction chamber is preferably about $500\pm25$ mtorr. The preferred flow rates that were demonstrated with the Tegal 1511e Plasma Reactor are about $50.0\pm5\%$, $10.0\pm5\%$, $15.0\pm5\%$, and $75.0\pm5\%$ standard cubic centimeters per minute (sccm) of $SF_6$, $Cl_2$, $O_2$ and inert carrier gas, respectively.

Power is applied as indicated above, and the wafer is subjected to the reactive gas mixture within the reactor vessel at the preselected pressure for a predetermined amount of time to selectively obtain a desired etch of the $WSi_x$/polysilicon by an isotropic method. The amount of time within the reactor will determine the amount of material to be etched, and correspondingly the width of the finished runner. The relationship of etch timing, power setting, and RFon:RFrepeat are important to provide the correct critical dimensions for the width of the runners. For example, an etch of a word line runner for a typical LDD CMOS transistor is approximately 1.1 $\mu$m wide and must stop on a 250 angstrom thick layer of oxide to form the transistor gate.

A fixed exposure for such an alignment was not determined at this writing, and would be determined after experimentation to provide the correct etching critical dimensions. The above etch chemistry is selective to the thin gate oxide material which would typically underlie the poly in such an LDD transistor. It is also selective to the substrate and photoresist materials. As such, the etch will not remove these materials, but only the $WSi_x$/polysilicon under the desired operating conditions.

Figure 6:
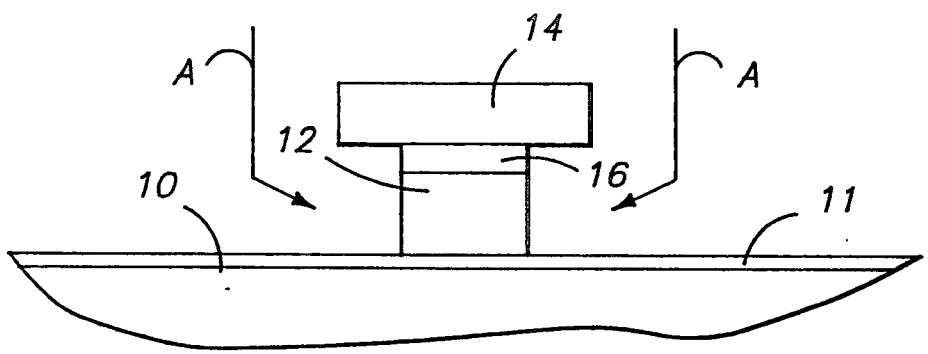
FIG. 6 is a diagrammatic sectional view of a substrate and $WSi_x$/polysilicon sandwich structure produced in accordance with aspects of the invention.

The above process will etch both the tungsten and poly at the same rate to enable producing an anisotropic etching effect beneath the overhanging photoresist by an isotropic etch, as illustrated by FIG. 6. The desired etching is conducted in a single step within the reactor to thereby produce the desired structure for the etch on the substrate. The substrate is then immediately ready for a next processing step after the etch.

In reducing the invention to practice, the Tegal 1511e reactor was operated at 500 mtorr, 150 watts of input power, and gas feeds of 50 sccm of $SF_6$, 10 sccm of $Cl_2$, 15 sccm of $O_2$, and 75 sccm of He. RFon was 1.5 ms and RFoff was 1.2 ms to produce the power/time profile illustrated in FIG. 7. The effective applied power was thereby 83 W. The etch was conducted for approximately 60 seconds, with the finished width of the $WSi_x$/polysilicon sandwich runner being 1.10 μm. The overlying resist width was 1.75 μm, and remained unchanged during the process to produce a structure such as illustrated in FIG. 6.

In compliance with the statute, the invention has been described in language more or less specific as to structural and methodical features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A method of isotropically dry etching a $WSi_x$/polysilicon sandwich structure atop a silicon substrate wafer containing integrated semiconductor circuits, the sandwich structure having an overlying photoresist masking portion, the method being conducted within a parallel plate reactor which in operation provides intermittent pulses of power over the parallel plates, the method comprising:
   injecting gases to within the reactor to provide a reactive gas mixture at a preselected pressure within the reactor, the reactive gas mixture comprising $SF_6$, $Cl_2$, and $O_2$ in approximate respective volume ratios of $10.0\pm5\%:2.0\pm5\%:3.0\pm5\%$;
   applying preselected intermittent pulses of a preselected amount of power to the parallel plates to ionize the reactive gas mixture into a plasma state, such intermittent pulses being defined by an RFon period, an RFoff period, and an RFrepeat period; the RFon period being that time period during which the preselected amount of power is applied to the plates, the RFoff period being that time period when a significantly reduced amount of power or no power is applied to the parallel plates, the RFrepeat period being the sum of a single RFon period and a single consecutively following RFoff period;
   subjecting the wafer to the intermittent pulses and reactive gas mixture at the preselected pressure for a preselected amount of time to isotropically etch the $WSi_x$ and polysilicon beneath the photoresist masking portion at substantially the same rate and provide a $WSi_x$/polysilicon runner having substantially vertical sides and having resist overhang projecting laterally from the vertical sides of the $WSi_x$/polysilicon runner.

2. The method of isotropically dry etching of claim 1 wherein the ratio of RFon:RFrepeat is from about 0.35 to 0.60.

3. The method of isotropically dry etching of claim 1 wherein the predetermined pressure is about $500\pm25$ mtorr.

4. The method of isotropically dry etching of claim 1 wherein,
   the ratio of RFon:RFrepeat is from about 0.35 to 0.60; and
   the predetermined pressure is about $500\pm25$ mtorr.

5. The method of isotropically dry etching of claim 1 wherein the predetermined amount of power produces a power density at the parallel plates during RFon of from about 0.76 to about 0.93 $W/cm^3$.

6. The method of isotropically dry etching of claim 1 wherein,
   the ratio of RFon:RFrepeat is from about 0.35 to 0.60; and
   the predetermined amount of power produces a power density at the parallel plates during RFon of from about 0.76 to about 0.93 $W/cm^3$.

7. The method of isotropically dry etching of claim 6 wherein the predetermined pressure is about $500\pm25$ mtorr.

8. The method of isotropically dry etching of claim 1 further comprising injecting an inert carrier gas into the reactor with the gases that form the reactive gas mixture.

9. The method of isotropically dry etching of claim 8 wherein the inert gas is injected to provide a gas mixture within the reactor comprising $SF_6$, $Cl_2$, $O_2$, and inert carrier gas in approximate respective volume ratios of $10.0\pm5\%:2.0\pm5\%:3.0\pm5\%:15.0\pm5\%$.

10. The method of isotropically dry etching of claim 1 wherein,
   the ratio of RFon:RFrepeat is from about 0.35 to 0.60;
   the predetermined pressure is about $500\pm25$ mtorr;
   the predetermined amount of power produces a power density at the parallel plates during RFon of from about 0.76 to about 0.93 $W/cm^3$; and further comprising:
   injecting an inert carrier gas into the reactor with the gases that form the reactive gas mixture.

11. The method of isotropically dry etching of claim 10 wherein the inert gas is injected to provide a gas mixture within the reactor comprising $SF_6$, $Cl_2$, $O_2$, and inert carrier gas in approximate respective volume ratios of $10.0\pm5\%:2.0\pm5\%:3.0\pm5\%:15.0\pm5\%$.

12. The method of isotropically dry etching of claim 1 wherein the gases are injected at respective $SF_6$, $Cl_2$, and $O_2$ flow rates of about $50.0\pm5\%$, $10.0\pm5\%$, and $15.0\pm5\%$ standard cubic centimeters per minute.

13. The method of isotropically dry etching of claim 12 further comprising injecting an inert carrier gas into the reactor with the gases that form the reactive gas mixture, the inert carrier gas being injected into the reactor at a flow rate of about $75.0\pm5\%$ standard cubic centimeters per minute.

14. The method of isotropically dry etching of claim 1 further comprising conducting the desired etching of the $WSi_x$/polysilicon sandwich structure in a single step within the reactor to produce a desired structure on the substrate, with the substrate then being immediately ready for a next processing step.

* * * * *